US011675037B2

(12) United States Patent
Harris et al.

(10) Patent No.: US 11,675,037 B2
(45) Date of Patent: *Jun. 13, 2023

(54) SYSTEMS AND METHODS FOR MAGNETIC FIELD-DEPENDENT RELAXOMETRY USING MAGNETIC RESONANCE IMAGING

(71) Applicant: SYNAPTIVE MEDICAL INC., Toronto (CA)

(72) Inventors: Chad Tyler Harris, Toronto (CA); David Mark Deschenes, Toronto (CA); Alexander Gyles Panther, Toronto (CA); Jeff Alan Stainsby, Toronto (CA); Philip J. Beatty, Toronto (CA)

(73) Assignee: Synaptive Medical Inc.

( * ) Notice: Subject to any disclaimer, the term of this patent is extended or adjusted under 35 U.S.C. 154(b) by 0 days.

This patent is subject to a terminal disclaimer.

(21) Appl. No.: 17/301,312

(22) Filed: Mar. 31, 2021

(65) Prior Publication Data

US 2021/0263121 A1 Aug. 26, 2021

Related U.S. Application Data

(63) Continuation of application No. 16/071,875, filed as application No. PCT/IB2016/050341 on Jan. 22, 2016, now Pat. No. 10,969,453.

(51) Int. Cl.
*G01R 33/50* (2006.01)
*G01R 33/38* (2006.01)
(Continued)

(52) U.S. Cl.
CPC ......... *G01R 33/50* (2013.01); *G01R 33/3804* (2013.01); *G01R 33/3815* (2013.01); *G01R 33/445* (2013.01)

(58) Field of Classification Search
CPC .......... G01R 33/50; G01R 33/3804; G01R 33/3815; G01R 33/445
See application file for complete search history.

(56) References Cited

U.S. PATENT DOCUMENTS 5,322,682 A 6/1994 Bartzokis
5,860,921 A 1/1999 Ma
(Continued)

FOREIGN PATENT DOCUMENTS

CN 101006356 7/2007
CN 101166992 4/2008
(Continued)

OTHER PUBLICATIONS

Dusek, P., et al. "Imaging of iron." International review of neurobiology. vol. 110. Academic Press, 2013. 195-239.
(Continued)

*Primary Examiner* — Feba Pothen

(57) ABSTRACT

Systems and methods for magnetic field-dependent relaxometry using magnetic resonance imaging ("MRI") are provided. Relaxation parameters, including longitudinal relaxation time ("T1") and transverse relaxation time ("T2"), are estimated from magnetic resonance signal data acquired at multiple different magnetic field strengths using the same MRI system. By measuring these relaxation parameters as a function of magnetic field strength, T1 dispersion data, T2 dispersion data, or both, are generated. Based on this dispersion data, quantitative physiological parameters can be estimated. As one example, iron content can be estimated from T2 dispersion data.

16 Claims, 2 Drawing Sheets

(51) Int. Cl.
*G01R 33/3815* (2006.01)
*G01R 33/44* (2006.01)

(56) References Cited

U.S. PATENT DOCUMENTS

| | | | |
|---|---|---|---|
| 7,298,602 | B2 | 11/2007 | Knight |
| 9,423,480 | B2 | 8/2016 | Mford |
| 9,943,246 | B2 * | 4/2018 | Reeder ............... A61B 5/4244 |
| 10,168,405 | B2 * | 1/2019 | Kang ..................... G01R 33/50 |
| 10,552,953 | B2 * | 2/2020 | Sugiura ............... G01R 33/546 |
| 2003/0185760 | A1 | 10/2003 | Lanza |
| 2011/0118588 | A1 | 5/2011 | Komblau |
| 2011/0137612 | A1 | 6/2011 | Wang |
| 2018/0284141 | A1 | 10/2018 | Ayton |

FOREIGN PATENT DOCUMENTS

| | | |
|---|---|---|
| CN | 101189531 | 5/2008 |
| CN | 101268941 | 9/2008 |
| CN | 102116856 | 7/2011 |
| CN | 102439474 | 5/2012 |
| CN | 102859386 | 1/2013 |
| CN | 103218788 | 7/2013 |
| CN | 103376432 | 10/2013 |
| DE | 102008020574 | 10/2009 |
| JP | S63105750 | 5/1988 |
| JP | 2004-305759 | 11/2004 |
| JP | 2007-117523 | 5/2007 |
| WO | 2000010025 | 2/2000 |
| WO | 2017064539 | 4/2017 |

OTHER PUBLICATIONS

Examiner's report issued by the Canadian Intellectual Property Office in relation to corresponding Canadian Patent Application No. 3,012,161 dated May 31, 2019, 4 pgs.

International Searching Authority, International Search Report and Written Opinion for PCT/IB2016/050341, dated Apr. 21, 2016, 9 pages.

Office Action issued by Japanese Patent Office in relation to JP Application No. 2018-537812 dated Mar. 19, 2020, 3pgs.

Sullivan, E. V., et al. "Relevance of iron deposition in deep gray matter brain structures to cognitive and motor performance in healthy elderly men and women: exploratory findings." Brain imaging and behavior 3.2 (2009): 167-175.

Vymazal et al., "The relation between brain iron and NMR relaxation times: An in vitro study", Magnetic Resonance in Medicine, Jan. 1996, vol. 35 No. 1, pp. 56-61.

Office Action issued by the National Intellectual Property Administration of the People's Republic of China in relation to corresponding CN Application No. 2016800797232 dated Jun. 22, 2020, 7 pgs.

Search Report issued by the National Intellectual Property Administration of the People's Republic of China in relation to corresponding CN Application No. 2016800797232 dated Jun. 11, 2020, 3 pgs.

Search Report issued by the National Intellectual Property Administration of the People's Republic of China in relation to corresponding CN Application No. 2016800797232 dated May 17, 2021, 3 pgs.

Iwaoka, H. et al. IEEE Transactions on Medical Imaging; Optimal Pulse Sequences for Magnetic Resonance Imaging-Computing Accurate T1,T2,and Proton Density Images, Dec. 31, 1987.

* cited by examiner

SYSTEMS AND METHODS FOR MAGNETIC FIELD-DEPENDENT RELAXOMETRY USING MAGNETIC RESONANCE IMAGING

CROSS-REFERENCE TO RELATED APPLICATIONS

This application is a continuation of U.S. patent application Ser. No. 16/071,875 filed Jul. 20, 2018, which represents the national stage entry of International Application PCT/IB2016/050341 filed Jan. 22, 2016. The contents of each of these applications are herein incorporated by reference in their entirety.

BACKGROUND OF THE INVENTION

The field of the invention is systems and methods for magnetic resonance imaging ("MRI"). More particularly, the invention relates to systems and methods for magnetic field-dependent relaxometry using MRI.

The use of MRI as a quantitative tool has continued to attract great interest in the clinical and research communities. One of the most common MRI techniques for quantitative diagnosis is relaxometry, in which longitudinal relaxation time, $T_1$, transverse relaxation time, $T_2$, or both can be estimated in a region-of-interest and used to generate quantitative maps based on the relaxation times. In general, relaxometry techniques make use of sampling magnetic resonance signals at two or more different time points (e.g., echo times) using a long repetition time ("TR").

Imaging iron content in the body (and especially the brain) is very desirable. Iron content has been shown to correlate with multiple neurological disorders (e.g., Parkinson's and Alzheimer's disease). Current methods to image iron content revolve around quantifying the drop in magnetic resonance signal when the echo time of a gradient echo sequence is increased. This allows the apparent transverse relaxation rate, $R_2^*=1/T_2^*$, to be measured in vivo. However, $R_2^*$ can change for many reasons that might not be associated to iron content. Furthermore, this technique is not very sensitive to small quantities of iron.

Longitudinal and transverse relaxation times have been shown to be dependent on magnetic field strength. For instance, the transverse relaxation times, $T_2$, of ferritin solutions show a linear increase with magnetic field strength, with the slope of this increase depending on the ferritin loading factor. If the $T_2$ of tissues at multiple field strengths can be computed, then iron content can be estimated. Moreover, it may be possible to determine which form the iron is deposited in, which could be very advantageous in trying to identify iron's role in neurological disorders.

These magnetic field-dependent relaxometry techniques have not been adopted for routine clinical implementation, however, because they require estimating the relaxation parameters at multiple different magnetic field strengths. Using currently available technology, this requirement is generally satisfied only by moving the subject between multiple different MRI systems, each with a different magnetic field strength (e.g., a 0.5 T, 1.0 T, 1.5 T, and 3 T system.

Thus, there remains a need for providing systems and methods for magnetic field-dependent relaxometry that can be readily implemented in clinical and research environments without the need for multiple different MRI systems.

SUMMARY OF THE INVENTION

The present invention overcomes the aforementioned drawbacks by providing a method for magnetic field-dependent relaxometry using magnetic resonance imaging ("MRI"). The method includes acquiring first data from a subject using an MRI system having a main magnetic field at a first magnetic field strength by sampling a first magnetic resonance signal at a first plurality of time points. The main magnetic field of the MRI system is then adjusted to a second magnetic field strength and second data are acquired from the subject using the MRI system while the main magnetic field of the MRI system is at the second magnetic field strength by sampling a second magnetic resonance signal at a second plurality of time points. A first value of a relaxation parameter is estimated by fitting the first data to a signal model that describes magnetic resonance signal relaxation as a function of the relaxation parameter, and a second value of the relaxation parameter is estimated by fitting the second data to the signal model. Dispersion data are then generated by associating the first value of the relaxation parameter with the first magnetic field strength and the second value of the relaxation parameter with the second magnetic field strength.

It is another aspect of the present invention to provide A method for producing a map of a quantitative physiological parameter in a region in a subject using MRI. Magnetic resonance signals are generated in the region using the MRI system, and a data set is acquired from the region using the MRI system by sampling the magnetic resonance signals generated in the region. These steps are repeated a plurality of times to acquire a plurality of data sets. Each of the data sets is acquired at a different magnetic field strength by adjusting the magnetic field strength of the main magnetic field of the MRI system before generating the magnetic resonance signals in the region. Values of a relaxation parameter are estimated in the region by fitting each of the plurality of data sets to a signal model that describes magnetic resonance signal relaxation as a function of the relaxation parameter. Dispersion data are then generated for each location in the region by associating estimated values of the relaxation parameter with the magnetic field strength at which the data set used to estimate the values of the relaxation parameter was acquired. A map of a quantitative physiological parameter in the region is generated by computing the quantitative physiological parameter at each location in the region from the dispersion data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for magnetic field-dependent relaxometry using magnetic resonance imaging ("MRI"). Relaxometry generally refers to the measurement of relaxation parameters, including longitudinal relaxation time ("T1") and transverse relaxation time ("T2"). By measuring these relaxation parameters as a function of magnetic field strength, T1 dispersion data, T2 dispersion data, or both, can be obtained. Based on this dispersion data, quantitative physiological parameters can be estimated. As one example, iron content can be estimated from T2 dispersion data.

Currently, relaxation dispersion data can be obtained by imaging a subject in a number of different MRI systems, each with a different magnetic field strength. This approach has several limitations. For instance, the approach requires access to several different MRI systems, each with different field strengths, which may not be available at most clinical sites. Also, because the subject must be moved between multiple different MRI systems, the images of the subject from the different MRI systems must be co-registered before dispersion data can be generated from them.

The systems and methods of the present invention, however, utilize a single MRI system that can be operated to rapidly ramp its main magnetic field strength, thereby allowing for measurements of relaxation parameters at multiple different field strengths without having to move the subject.

Figure 1:
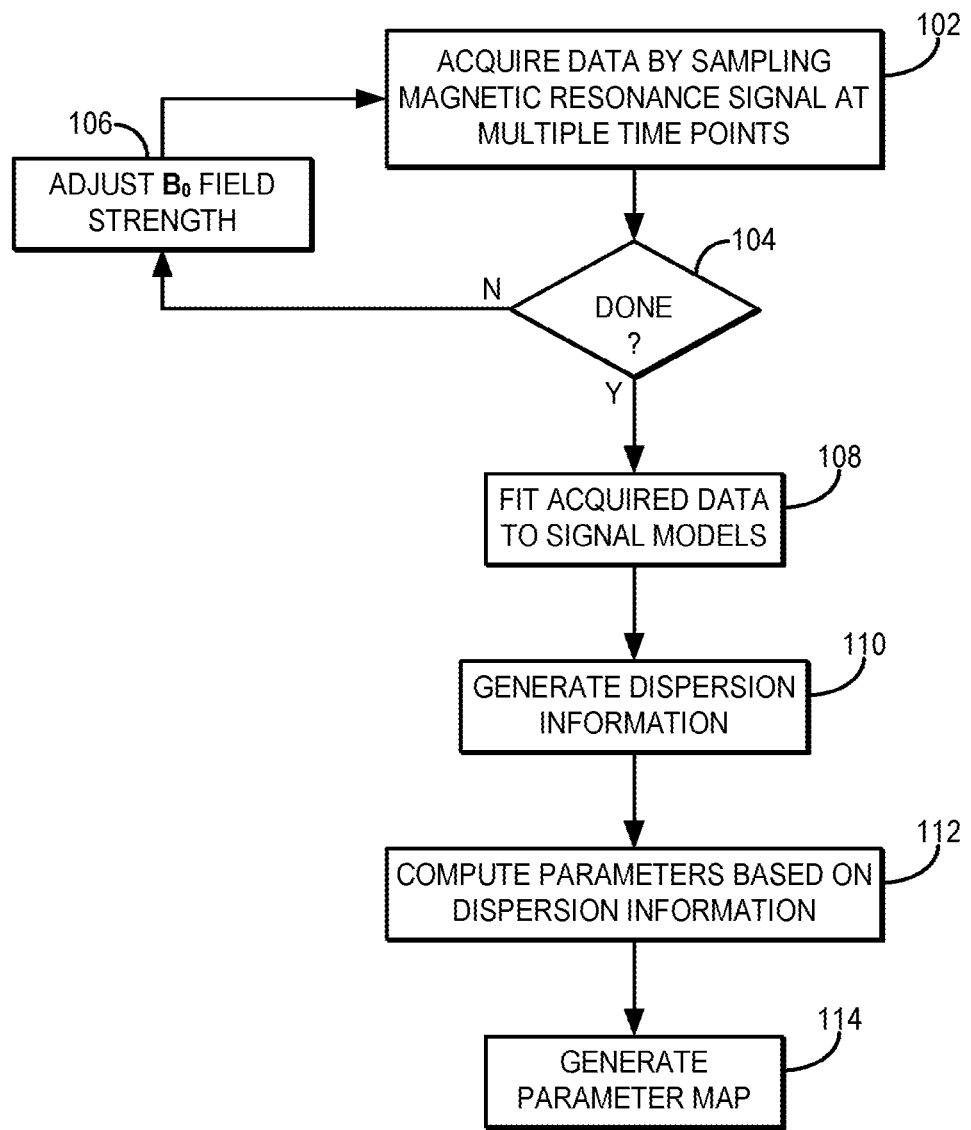
FIG. 1 is a flowchart setting forth the steps of an example method for magnetic field-dependent relaxometry using a magnetic resonance imaging ("MRI") system, and for optionally generating maps of quantitative physiological parameters based on dispersion data.

Referring now to FIG. 1, a flowchart is illustrated as setting forth the steps of an example method for measuring relaxation parameter dispersion using MRI.

The method includes directing the MRI system to perform a pulse sequence that acquires data by sampling a magnetic resonance signal at various time points, as indicated at step 102. In general, the magnetic resonance signal is generated by nuclear spins relaxing back to equilibrium and thus can include a free induction decay ("FID") signal, a gradient echo signal, a spin echo signal, a stimulated echo signal, or any other suitable magnetic resonance signal. In general, the MRI system is operated to generate magnetic resonance signals across a region of the subject, such as an image slice, image slab, image volume, or other spatially localized region-of-interest.

It will be appreciated by those skilled in the art that the choice of pulse sequence will influence the type of magnetic resonance signal that is formed and also the relaxation parameter to be studied. For instance, an inversion recovery or T1-weighted pulse sequence may be used for examining longitudinal relaxation, whereas a T2-weighted pulse sequence may be used for examining transverse relaxation.

A determination is made at decision block 104 whether data have been acquired at a desired number of different magnetic field strengths. If not, then the magnetic field strength is adjusted, as indicated at step 106, and additional data are acquired at the new magnetic field strength. Thus, the method includes acquiring data at least at a first magnetic field strength and a second magnetic field strength; however, the process can be generally repeated to acquire a plurality of data sets at each of a plurality of different magnetic field strengths. Accordingly, in a preferred MRI system, a tunable RF coil is implemented, such that the RF coil can be tuned to the appropriate resonance frequencies associated with the different magnetic field strengths. Likewise, a broadband receiver can preferably be implemented to provide a wide range of resonance frequencies, and thus field strengths, that can be used in a single scan. Examples of such tunable RF coils and broadband receivers will be appreciated by those skilled in the art.

In one specific embodiment, the magnetic field is adjusted using an MRI system that is capable of rapidly ramping up or down its main magnetic field. As example of such a system is described in co-pending PCT Application Serial No. PCT/IB2015/057979. With this type of system, the main magnetic field can be ramped to different strengths depending on the amount of applied current. Advantageously, the main magnetic field in can be ramped in a clinically reasonable amount of time. As one example, the main magnetic field can be ramped from zero to 0.5 T in about ten minutes. As another example, the main magnetic field can be ramped from 0.5 T to 0.4 T in about one minute or less. Thus, in some embodiments, the magnetic field strength of the main magnetic field can be ramped between a first and second value in less than fifteen minutes, and in some embodiments less than two minutes.

Using such a system, then, the main magnetic field can be incrementally adjusted to acquire data at multiple different field strengths in a clinically reasonable span of time, thereby providing magnetic field-dependent relaxometry. As one example, the main magnetic field can be adjusted in increments of 0.1 T; however, it will be appreciated that other increments greater or less than 0.1 T can also be used (e.g., 0.05 T, 0.2 T, 0.25 T, 0.5 T). In some embodiments, the main magnetic field can be further adjusted using a coil insert to modulate the local magnetic field in the MRI system.

When data have been acquired at all of the desired magnetic field strengths, the data are fit to the appropriate signal models to extract relaxation parameters as a function of magnetic field strength, as indicated at step 108. In general, the signal model used is a signal model that describes the relaxation of magnetic resonance signals as a function of a relaxation parameter, such as transverse relaxation time, transverse relaxation rate, apparent transverse relaxation time, apparent transverse relaxation rate, longitudinal relaxation time, or longitudinal relaxation rate. This step may include reconstructing images from the acquired data and fitting the image magnitude, image phase, or both, to the appropriate signal model. As one example, image magnitudes at the various sampled time points can be fit to a signal model based on the Bloch equations, which relate measured signal intensity to one or both of the relaxation time parameters, T1 and T2. As another example, the signal model can be based on an exponential decay model for estimating T2, or a recovery signal model for estimating T1. As a result of this step, values of the relaxation parameters are estimated for each magnetic field strength at which data were acquired. In some embodiments, maps of the relaxation parameters can be generated, which depict the spatial distribution of the relaxation parameters in a region of the subject, such as the imaged field-of-view.

Dispersion data can then be generated by associating the estimated relaxation parameters with the respective magnetic field strengths, as indicated at step 110. As one example, the dispersion data can include curves or other plots that describe relaxation parameters as a function of magnetic field strength.

Using the dispersion data, other physical parameters associated with the subject being examined can be computed, as indicated at step 112. As a general example, quantitative physiological parameters can be estimated from the dispersion data. As one non-limiting example, iron content in tissue can be computed from T2 dispersion data. As another non-limiting example, albumin content can be estimated in applications where a contrast agent, such as Vasovist® (also known as Albavar®) manufactured by Lantheus Medical Imaging, Inc.) is bound to albumin. In some instances, albumin content can be measured using a delta relaxation enhanced magnetic resonance ("dreMR") technique. Other parameters that can be measured from dreMR contrast can also be estimated. In general, it will be appreciated by those skilled in the art, however, that any suitable physical or physiological parameters associated with one or more relaxation parameters can be estimated or computed.

Maps of these parameters can be generated to depict the spatial distribution of the estimated parameters in the imaged field-of-view, as indicated at step 114. These maps can be useful for identifying regions in the subject that have certain physical characteristics attributable to the estimated parameters. For instance, in the example above, the maps can be useful for identifying regions in the subject that have varying degrees of iron content.

Example MRI System

Figure 2:
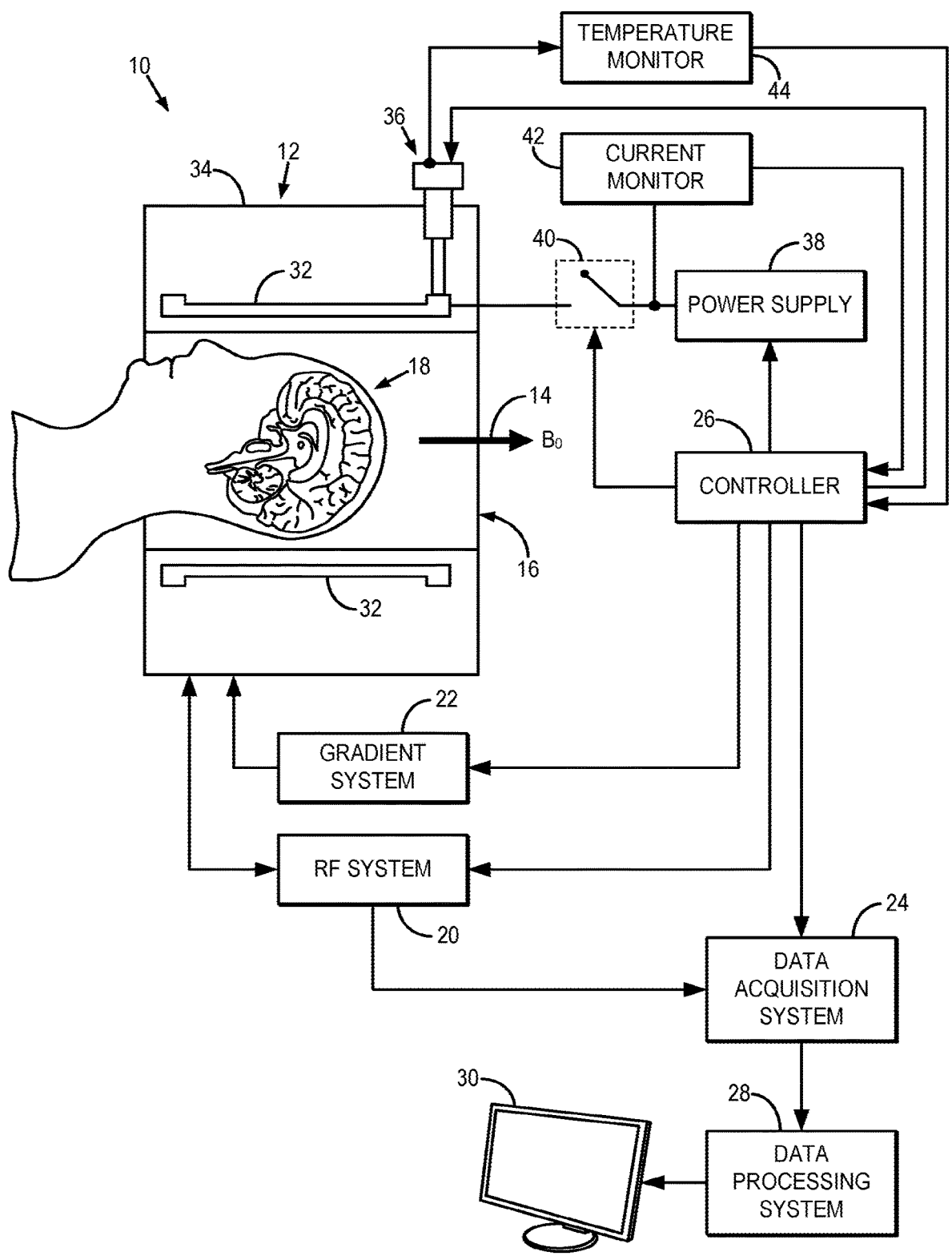
FIG. 2 is a block diagram of an example MRI system that can implement the method of the present invention.

Referring now to FIG. 2, an example of an MRI system 10 that is capable of rapidly ramping its magnetic field is illustrated. The MRI system 10 generally includes a magnet assembly 12 for providing a magnetic field 14 that is substantially uniform within a bore 16 that may hold a subject 18 or other object to be imaged. The magnet assembly 12 supports a radio frequency ("RF") coil (not shown) that may provide an RF excitation to nuclear spins in the subject 18 or object positioned within the bore 16. The RF coil communicates with an RF system 20 producing the necessary electrical waveforms, as is understood in the art. In some embodiments, the RF coil can be a tunable RF coil that can be tuned to various different resonance frequencies (e.g., resonance frequencies associated with different magnetic field strengths), as is understood in the art. The RF system 20 can, in some embodiments, include a broadband receiver capable of receiving magnetic resonance signals across a broad range of resonance frequencies, thereby allowing a similarly broad range of different magnetic field strengths to be implemented.

The magnet assembly 12 also supports three axes of gradient coils (not shown) of a type known in the art, and which communicate with a corresponding gradient system 22 providing electrical power to the gradient coils to produce magnetic field gradients, $G_x$, $G_y$, and $G_z$ over time.

A data acquisition system 24 connects to RF reception coils (not shown) that are supported within the magnet assembly 12 or positioned within bore 16.

The RF system 20, gradient system 22, and data acquisition system 24 each communicates with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils 32 housed in a vacuum housing 34, which generally provides a cryostat for the magnet coils 32, and mechanically cooled by a mechanical cryocooler 36, such as a Gifford-McMahon ("GM") cryocooler or a pulse tube cryocooler. In one example configuration, the cryocooler can be a Model RDK-305 Gifford-McMahon cryocooler manufactured by Sumitomo Heavy Industries (Japan). In general, the cryocooler 36 is in thermal contact with the magnet coils 32 and is operable to lower the temperature of the magnet coils 32 and to maintain the magnet coils 32 and a desired operating temperature. In some embodiments the cryocooler 36 includes a first stage in thermal contact with the vacuum housing 34 and a second stage in thermal contact with the magnet coils 32. In these embodiments, the first stage of the cryocooler 36 maintains the vacuum housing 34 at a first temperature and the second stage of the cryocooler 36 maintains the magnet coils 32 at a second temperature that is lower than the first temperature.

The magnet coils 32 are composed of a superconducting material and therefore provide a superconducting magnet. The superconducting material is preferably selected to be a material with a suitable critical temperature such that the magnet coils 32 are capable of achieving desired magnetic field strengths over a range of suitable temperatures. As one example, the superconducting material can be niobium ("Nb"), which has a transition temperature of about 9.2 K. As another example, the superconducting material can be niobium-titanium ("NbTi"), which has a transition temperature of about 10 K. As still another example, the superconducting material can be triniobium-tin ("$Nb_3Sn$"), which has a transition temperature of about 18.3 K.

The choice of superconducting material will define the range of magnetic field strengths achievable with the magnet assembly 12. Preferably, the superconducting material is chosen such that magnetic field strengths in the range of about 0.0 T to about 3.0 T can be achieved over a range of temperatures that can be suitably achieved by the cryocooler 36. In some configurations, however, the superconducting material can be chosen to provide magnetic field strengths higher than 3.0 T.

The cryocooler 36 is operable to maintain the magnet coils 32 at an operational temperature at which the magnet coils 32 are superconducting, such as a temperature that is below the transition, or critical, temperature for the material of which the magnet coils 32 are composed. As one example, a lower operational temperature limit can be about 4 K and an upper operational temperature limit can be at or near the transition, or critical, temperature of the superconducting material of which the magnet coils 32 are composed.

The current density in the magnet coils 32 in the MRI system 10 is controllable to rapidly ramp up or ramp down the magnetic field 14 generated by the magnet assembly 12 while controlling the temperature of the magnet coils 32 with the cryocooler 36 to keep the temperature below the transition temperature of the superconducting material of which the magnet coils 32 are composed. As one example, the magnetic field 14 can be ramped up or ramped down on the order of minutes, such as fifteen minutes or less.

In general, the current density in the magnet coils 32 can be increased or decreased by connecting the magnet coils 32 to a circuit with a power supply 38 that is in electrical communication with the magnet coils 32 via a switch 40 and operating the power supply 38 to increase or decrease the current in the connected circuit. The switch 40 is generally a superconducting switch that is operable between a first, closed, state and a second, open, state.

When the switch 40 is in its open state, the magnet coils 32 are in a closed circuit, which is sometimes referred to as a "persistent mode." In this configuration, the magnet coils 32 are in a superconducting state so long as the temperature of the magnet coils 32 is maintained at a temperature at or below the transition temperature of the superconducting material of which they are composed.

When the switch 40 is in the closed state, however, the magnet coils 32 and the power supply 38 can be placed in a connected circuit, and the current supplied by the power supply 38 and the current in the magnet coils 32 will try to equalize. For instance, if the power supply 38 is operated to supply more current to the connected circuit, the current in the magnet coils 32 will increase, which will increase the strength of the magnetic field 14. On the other hand, if the power supply 38 is operated to decrease the current in the connected circuit, the current in the magnet coils 32 will decrease, which will decrease the strength of the magnetic field 14.

It will be appreciated by those skilled in the art that any suitable superconducting switch can be used for selectively connecting the magnet coils 32 and power supply 38 into a connected circuit; however, as one non-limiting example, the switch 40 may include a length of superconducting wire that is connected in parallel to the magnet coils 32 and the power supply 38. To operate such a switch 40 into its closed state, a heater in thermal contact with the switch 40 is operated to raise the temperature of the superconducting wire above its transition temperature, which in turn makes the wire highly resistive compared to the inductive impedance of the magnet coils 32. As a result, very little current will flow through the switch 40. The power supply 38 can then be placed into a connected circuit with the magnet coils 32. When in this connected circuit, the current in the power supply 38 and the magnet coils 32 will try to equalize; thus, by adjusting the current supplied by the power supply 38, the current density in the magnet coils 32 can be increased or decreased to respectively ramp up or ramp down the magnetic field 14. To operate the switch 40 into its open state, the superconducting wire in the switch 40 is cooled below its transition temperature, which places the magnet coils 32 back into a closed circuit, thereby disconnecting the power supply 38 and allowing all of the current to flow through the magnet coils 32.

When the magnet coils 32 are in the connected circuit with the power supply 38, the temperature of the magnet coils 32 will increase as the current in the connected circuit equalizes. Thus, the temperature of the magnet coils 32 should be monitored to ensure that the temperature of the magnet coils 32 remains below the transition temperature for the superconducting material of which they are composed. Because placing the magnet coils 32 into a connected circuit with the power supply 38 will tend to increase the temperature of the magnet coils 32, the rate at which the magnetic field 14 can be ramped up or ramped down will depend in part on the cooling capacity of the cryocooler 36. For instance, a cryocooler with a larger cooling capacity will be able to more rapidly remove heat from the magnet coils 32 while they are in a connected circuit with the power supply 38.

The power supply 38 and the switch 40 operate under control from the controller 26 to provide current to the magnet coils 32 when the power supply 38 is in a connected circuit with the magnet coils 32. A current monitor 42 measures the current flowing to the magnet coils 32 from the power supply 38, and a measure of the current can be provided to the controller 26 to control the ramping up or ramping down of the magnetic field 14. In some configurations, the current monitor 42 is integrated into the power supply 38.

A temperature monitor 44 is in thermal contact with the magnet assembly 12 and operates to measure a temperature of the magnet coils 32 in real-time. As one example, the temperature monitor 44 can include a thermocouple temperature sensor, a diode temperature sensor (e.g., a silicon diode or a GaAlAs diode), a resistance temperature detector ("RTD"), a capacitive temperature sensor, and so on. RTD-based temperature sensors can be composed of ceramic oxynitride, germanium, or ruthenium oxide. The temperature of the magnet coils 32 is monitored and can be provided to the controller 26 to control the ramping up or ramping down of the magnetic field 14.

In operation, the controller 26 is programmed to ramp up or ramp down the magnetic field 14 of the magnet assembly 12 in response to instructions from a user. As mentioned above, the magnetic field 14 can be ramped down by decreasing the current density in the magnet coils 32 by supplying current to the magnet coils 32 from the power supply 38 via the switch 40, which is controlled by the controller 26. Likewise, the strength of the magnetic field 14 can be ramped up by increasing the current density in the magnet coils 32 by supplying current to the magnet coils 32 from the power supply 38 via the switch 40, which is controlled by the controller 26.

The controller 26 is also programmed to monitor various operational parameter values associated with the MRI system 10 before, during, and after ramping the magnetic field 14 up or down. As one example, as mentioned above, the controller 26 can monitor the current supplied to the magnet coils 32 by the power supply 38 via data received from the current monitor 42. As another example, as mentioned above, the controller 26 can monitor the temperature of the magnet coils 32 via data received from the temperature monitor 44. As still another example, the controller 26 can monitor the strength of the magnetic field 14, such as by receiving data from a magnetic field sensor, such as a Hall probe or the like, positioned in or proximate to the bore 16 of the magnet assembly 12.

One or more computer systems can be provided with the MRI system 10 for processing acquired data in accordance with the methods described above. As one example, the data processing system 28 can be used to process the acquired data.

For example, the data processing system 28 can receive magnetic resonance data from the data acquisition system 24 and processes it in accordance with instructions downloaded from an operator workstation. Such processing may include those methods described above for reconstructing images, fitting signals to signal models, generating dispersion data, and computing quantitative or physical parameters from dispersion data.

Images reconstructed by the data processing system 28 can be conveyed back to the operator workstation for storage, and real-time images can be stored in a memory, from which they may be output to display 30.

The MRI system 10 may also include one or more networked workstations. By way of example, a networked workstation may include a display; one or more input devices, such as a keyboard and mouse; and a processor. The networked workstation may be located within the same facility as the MRI system 10, or in a different facility, such as a different healthcare institution or clinic.

The networked workstation, whether within the same facility or in a different facility as the MRI system 10, may gain remote access to the data processing system 28 via a communication system. Accordingly, multiple networked workstations may have access to the data processing system 28. In this manner, magnetic resonance data, reconstructed images, or other data may be exchanged between the data processing system 28 and the networked workstations, such that the data or images may be remotely processed by a networked workstation. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for magnetic field-dependent relaxometry using magnetic resonance imaging (MRI), the steps of the method comprising:
   (a) acquiring magnetic resonance data from a subject using an MRI system generating a main magnetic field generated by a superconducting magnet, wherein the magnetic resonance data are acquired at a plurality of different magnetic field strengths of the main magnetic field by ramping the main magnetic field generated by MRI system to the different magnetic field strengths while the magnetic resonance data are being acquired;
   (b) estimating relaxation parameters from the magnetic resonance data as a function of the plurality of different magnetic field strengths of the main magnetic field generated by the MRI system, thereby generating relaxation parameter dispersion data;
   (c) estimating a physical parameter associated with the subject from the relaxation parameter dispersion data;
   (d) estimating a first value of a relaxation parameter by fitting the first data to a signal model that describes magnetic resonance signal relaxation as a function of the relaxation parameter.

2. The method as recited in claim 1, wherein the main magnetic field generated by the MRI system is ramped to each of the different magnetic field strengths in less than fifteen minutes.

3. The method as recited in claim 2, wherein the main magnetic field generated by the MRI system is ramped to each of the different magnetic field strengths in less than two minutes.

4. The method as recited in claim 1, wherein a difference between each of the plurality of different magnetic field strengths is between 0.05 Tesla and 0.5 Tesla.

5. The method as recited in claim 4, wherein the difference between each of the plurality of different magnetic field strengths is about 0.1 Tesla.

6. The method as recited in claim 4, wherein the difference between each of the plurality of different magnetic field strengths is about 0.05 Tesla.

7. The method as recited in claim 1, wherein the relaxation parameters comprise one of transverse relaxation times or transverse relaxation rates.

8. The method as recited in claim 6, wherein the physical parameter is an estimate of iron content in the subject.

9. The method as recited in claim 1, wherein the relaxation parameters comprise one of longitudinal relaxation times or longitudinal relaxation rates.

10. A magnetic resonance imaging (MRI) system, comprising:
   magnet coils for generating a magnetic field, wherein the magnet coils are composed of a superconducting material;
   a power supply;
   a superconducting switch selectively connecting the magnet coils to the power supply and having an open state and a closed state, wherein when in the closed state the superconducting switch connects the magnet coils and the power supply in a connected circuit;
   a controller programmed to ramp the magnetic field generated by the magnet coils between a plurality of different magnetic field strengths by adjusting the current generated by the power supply when the superconducting switch is in its closed position;
   a mechanical cryocooler in thermal contact with the magnet coils and operable to reduce and maintain a temperature of the magnet coils below a transition temperature of the superconducting material while the magnetic field generated by the magnet coils is being ramped between the plurality of different magnetic field strengths;
   a radio frequency (RF) system comprising an RF coil operable to provide RF excitation and a receiver operable to detect magnetic resonance signals; and
   a processor in communication with the controller and the RF system, wherein the processor is configured to:
      control the controller to ramp the magnetic field though the plurality of different magnetic field strengths;
      control the RF system to provide RF excitation with the RF coil while the magnetic field is ramped to each of the plurality of different magnetic field strengths; and
      control the RF system to receive magnetic resonance signals at each of the plurality of different magnetic field strengths via the receiver;
      acquire the magnetic resonance data from a subject using an MRI system generating a main magnetic field generated by a superconducting magnet, wherein the magnetic resonance data are acquired at a plurality of different magnetic field strengths of the main magnetic field by ramping the main magnetic field generated by MRI system to the different magnetic field strengths while the magnetic resonance data are being acquired; and
      estimating a first value of a relaxation parameter by fitting the first data to a signal model that describes magnetic resonance signal relaxation as a function of the relaxation parameter;
   wherein the processor is configured to control the controller to ramp the magnetic field though the plurality of different magnetic field strengths such that a difference between each of the plurality of different magnetic field strengths is between 0.05 Tesla and 0.5 Tesla.

11. The MRI system as recited in claim 10, wherein the RF coil comprises a tunable RF coil and the processor is configured to tune the RF coil to a different resonance frequency at each of the plurality of different magnetic field strengths.

12. The MRI system as recited in claim 10, wherein the receiver comprises a broadband receiver that is tuned to detect magnetic resonance signals over a range of resonance frequencies corresponding to the plurality of different magnetic field strengths.

13. The MRI system as recited in claim 10, wherein the processor is configured to control the controller to ramp the magnetic field though the plurality of different magnetic field strengths in less than fifteen minutes.

14. The MRI system as recited in claim 13, wherein the processor is configured to control the controller to ramp the magnetic field though the plurality of different magnetic field strengths in less than two minutes.

15. The MRI system as recited in claim 10, wherein the processor is configured to control the controller to ramp the magnetic field though the plurality of different magnetic field strengths such that the difference between each of the plurality of different magnetic field strengths is about 0.1 Tesla.

16. The MRI system as recited in claim 10, wherein the processor is configured to control the controller to ramp the magnetic field though the plurality of different magnetic field strengths such that the difference between each of the plurality of different magnetic field strengths is about 0.05 Tesla.

* * * * *